United States Patent
Lee et al.

(10) Patent No.: US 10,032,843 B2
(45) Date of Patent: Jul. 24, 2018

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: Jae Sung Lee, Seoul (KR); Joon Suk Lee, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 22 days.

(21) Appl. No.: 14/850,572

(22) Filed: Sep. 10, 2015

(65) Prior Publication Data

US 2016/0079334 A1   Mar. 17, 2016

(30) Foreign Application Priority Data

Sep. 11, 2014 (KR) .................. 10-2014-0119964
Jul. 31, 2015 (KR) .................. 10-2015-0109224

(51) Int. Cl.
*H01L 27/32* (2006.01)
*H01L 51/56* (2006.01)

(52) U.S. Cl.
CPC ...... *H01L 27/3276* (2013.01); *H01L 27/3246* (2013.01); *H01L 27/3258* (2013.01); *H01L 51/56* (2013.01); *H01L 2227/323* (2013.01)

(58) Field of Classification Search
CPC combination set(s) only.
See application file for complete search history.

(56) References Cited

U.S. PATENT DOCUMENTS

| 2003/0132927 | A1 | 7/2003 | Ouchi et al. |
| 2006/0060850 | A1 | 3/2006 | Kwak et al. |
| 2007/0194699 | A1* | 8/2007 | Lee ............. H01L 27/3276 313/505 |
| 2007/0241664 | A1 | 10/2007 | Sakamoto et al. |
| 2008/0044982 | A1* | 2/2008 | You ............. H01L 27/12 438/443 |
| 2009/0015153 | A1* | 1/2009 | Asano ........... H01L 51/5237 313/504 |
| 2009/0058280 | A1 | 3/2009 | Jo et al. |

(Continued)

FOREIGN PATENT DOCUMENTS

| CN | 101097946 A | 1/2008 |
| EP | 2031658 A2 | 3/2009 |

*Primary Examiner* — Ratisha Mehta
(74) *Attorney, Agent, or Firm* — Birch, Stewart, Kolasch & Birch, LLP (57) ABSTRACT

Discussed is an organic light emitting display device in which an auxiliary electrode is disposed on an overcoating layer, and thus, an aperture ratio is enhanced. The organic light emitting display device can include a first overcoating layer disposed on a driving transistor and a supply electrode, a connection electrode disposed on the first overcoating layer and connected to the supply electrode through the second contact hole, a first electrode disposed on the first overcoating layer and connected to the driving transistor through the first contact hole, a second overcoating layer disposed on the first overcoating layer, and an auxiliary electrode disposed on the second overcoating layer and connected to the connection electrode. The first overcoating layer may include a first contact hole and a second contact hole. The second overcoating layer may cover the first and second contact holes and may not cover a portion of the first electrode.

8 Claims, 6 Drawing Sheets

(56) References Cited

U.S. PATENT DOCUMENTS

2010/0025664 A1    2/2010  Park
2014/0154829 A1    6/2014  Oh et al.
2015/0069356 A1*  3/2015  Lee .................... H01L 51/5206
                                                              257/40

* cited by examiner

ORGANIC LIGHT EMITTING DISPLAY DEVICE AND METHOD OF MANUFACTURING THE SAME

CROSS-REFERENCE TO RELATED APPLICATIONS

This application claims the priority benefit of the Korean Patent Application No. 10-2014-0119964 filed on Sep. 11, 2014 and 10-2015-0109224 filed on Jul. 31, 2015, which are all hereby incorporated by reference as if fully set forth herein.

BACKGROUND OF THE INVENTION

Field of the Invention

The present invention relates to an organic light emitting display device and a method of manufacturing the same, and more particularly, to an organic light emitting display device including an auxiliary electrode formed on an overcoating layer and a method of manufacturing the same.

Description of the Related Art

As the times advance to the information-oriented society, flat panel displays (FPDs) which have good characteristics such as thinness, lightness, and low consumption power are increasing in importance. Examples of the FPD device includes a liquid crystal display (LCD) device, plasma display panel (PDP), organic light-emitting display device, etc. Recently, an electrophoretic display (EPD) device is being widely used as one type of the FPD.

In particular, an organic light emitting display device is self-emitting device and has low power consumption, a fast response time, high emission efficiency, high luminance, and a wide viewing angle in comparison with other display devices. Therefore, the organic light emitting display device is attracting much attention as the next-generation flat panel display.

Figure 1:
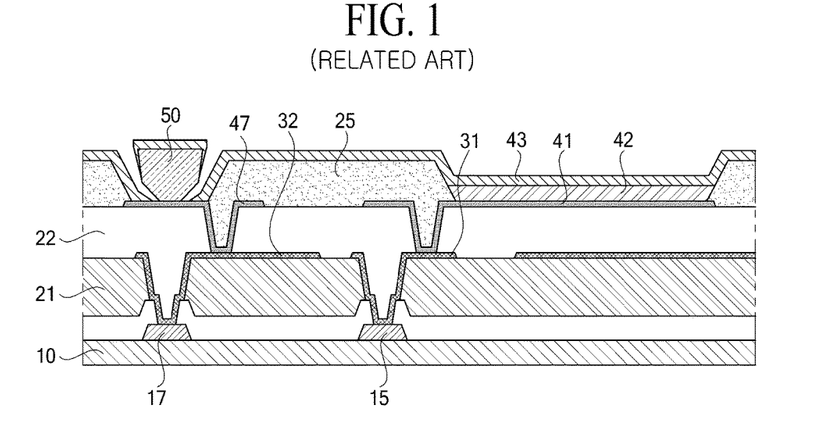
FIG. 1 is a cross-sectional view illustrating a related art organic light emitting display device.

FIG. 1 is a cross-sectional view illustrating a related art organic light emitting display device.

As illustrated in FIG. 1, the related art organic light emitting display device includes a driving transistor, a power connection electrode 17, a first planarization layer 21, a first lower auxiliary electrode 31, and a second lower auxiliary electrode 32. The driving transistor is formed on a substrate 10. The power connection electrode 17 is formed on the same layer as a source/drain electrode 15 of the driving transistor. The first planarization layer 21 is formed on the source/drain electrode 15 and the power connection electrode 17. The first lower auxiliary electrode 31 is formed on the first planarization layer 21 and is connected to the source/drain electrode 15. The second lower auxiliary electrode 32 is formed on the first planarization layer 21 and is connected to the power connection electrode 17.

Moreover, the related art organic light emitting display device includes a second planarization layer 22, an anode 41, and an upper auxiliary electrode 47. The second planarization layer 22 is formed on the first lower auxiliary electrode 31 and the second lower auxiliary electrode 32. The anode 41 is formed on the second planarization layer 22 and is connected to the first lower auxiliary electrode 31. The upper auxiliary electrode 47 is formed on the same layer as the anode 41.

Moreover, the related art organic light emitting display device includes a bank 25, a partition wall 50, an organic emission layer 42, and a cathode 43. The bank 25 divides the upper auxiliary electrode 47 from the anode 41. The partition wall 50 is formed on the upper auxiliary electrode 47. The organic emission layer 42 is formed on the anode 41. The cathode 43 is formed on the substrate 10. The cathode 43 is electrically connected to the upper auxiliary electrode 47.

As described above, in the related art organic light emitting display device, in order to lower a resistance of the upper auxiliary electrode 47, the first planarization layer 21 and the second planarization layer 22 are provided, and the lower auxiliary electrodes 31 and 32 are disposed between the first planarization layer 21 and the second planarization layer 22.

Moreover, the upper auxiliary electrode 47 is formed on the same layer as the anode 41. In this case, a width of the anode 41 is reduced, and thus, a pixel area is reduced. For this reason, an aperture ratio of the organic light emitting display device is reduced. Also, the image quality and lifetime of the organic light emitting display device are reduced.

SUMMARY OF THE INVENTION

Accordingly, the present invention is directed to provide an organic light emitting display device and a method of manufacturing the same that substantially obviate one or more problems due to limitations and disadvantages of the related art.

An object of the present invention is to provide an organic light emitting display device in which an auxiliary electrode is formed on an overcoating layer, and thus, an aperture ratio, image quality, and lifetime are enhanced.

Further, another object of the present invention is to provide a method of manufacturing an organic light emitting display device, which reduces the number of masks that are used in a manufacturing process, thereby simplifying the manufacturing process and decreasing the manufacturing cost.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including a first overcoating layer disposed on a driving transistor and a supply electrode, a connection electrode disposed on the first overcoating layer and connected to the supply electrode through the second contact hole, a first electrode disposed on the first overcoating layer and connected to the driving transistor through the first contact hole, a second overcoating layer disposed on the first overcoating layer, and an auxiliary electrode disposed on the second overcoating layer and connected to the connection electrode. The first overcoating layer may include a first contact hole and a second contact hole. The second overcoating layer may cover the first and second contact holes and may not cover a portion of the first electrode.

Further, according to an embodiment of the present invention, there is provided, the organic light emitting display device including the connection electrode is disposed on a same layer as the first electrode and comprises a same material as a material of the first electrode.

Further, according to an embodiment of the present invention, there is provided, the organic light emitting display device including the second overcoating layer is disposed between two adjacent sub-pixels.

Further, according to an embodiment of the present invention, there is provided, the organic light emitting display device including the second overcoating layer comprises a third contact hole, and the auxiliary electrode is connected to the connection electrode through the third contact hole.

Further, according to an embodiment of the present invention, there is provided, the organic light emitting display device including an organic emission layer disposed on the portion of the first electrode which is not covered by the second overcoating layer; and a second electrode disposed on the organic emission layer and electrically connected to the auxiliary electrode.

Further, according to an embodiment of the present invention, there is provided, the organic light emitting display device including a partition wall disposed to contact an upper side of the auxiliary electrode, wherein the organic emission layer is not disposed near an area where the auxiliary electrode contacts the partition wall.

Further, according to an embodiment of the present invention, there is provided, the organic light emitting display device including the first electrode is an anode, the second electrode is a cathode, and light emitted from the organic emission layer is irradiated in a direction from the anode to the cathode. Further, according to an embodiment of the present invention, there is provided a method of manufacturing an organic light emitting display device including forming a first planarization layer on a driving transistor and a supply electrode, forming, on the first planarization layer, a first electrode connected to the driving transistor and a connection electrode connected to the supply electrode, forming a second planarization layer that covers the first electrode and the connection electrode, forming an auxiliary electrode, connected to the connection electrode, on the second planarization layer, and etching a specific region of the second planarization layer to expose at least a portion of the first electrode.

Further, according to an embodiment of the present invention, there is provided a method of manufacturing an organic light emitting display device including the forming of the auxiliary electrode comprises: depositing an electrode material on the second planarization layer; coating a photoresist on the electrode material; irradiating light onto a portion of the coated photoresist disposed in the specific region to remove the portion of coated photoresist; and etching the electrode material which has been exposed by removing the portion of coated photoresist disposed in the specific region.

Further, according to an embodiment of the present invention, there is provided a method of manufacturing an organic light emitting display device including the etching of the specific region of the second planarization layer comprises dry-etching the specific region of the second planarization layer, the specific region is a portion of the second planarization layer where the auxiliary electrode is not formed, and in the dry-etching, the auxiliary electrode is not etched due to a photoresist disposed on the auxiliary electrode.

Further, according to an embodiment of the present invention, there is provided a method of manufacturing an organic light emitting display device including forming a partition wall on the auxiliary electrode; forming an organic emission layer on the exposed first electrode; and forming a second electrode on the organic emission layer to be connected to the auxiliary electrode.

Further, according to an embodiment of the present invention, there is provided an organic light emitting display panel including a first overcoating layer, a second overcoating layer disposed on the first overcoating layer, and an anode disposed on the first overcoating layer. The organic light emitting display panel may have a top emission type where at least a portion of the anode overlaps the auxiliary electrode disposed on the second overcoating layer with the second overcoating layer therebetween.

Further, according to an embodiment of the present invention, there is provided an organic light emitting display panel including the anode has an opening width that is broader than when the auxiliary electrode and the anode are disposed on the same overcoating layer.

Further, according to an embodiment of the present invention, there is provided an organic light emitting display panel including an organic emission layer disposed on the anode, wherein the organic emission layer does not overlap the second overcoating layer and the auxiliary electrode.

Further, according to an embodiment of the present invention, there is provided an organic light emitting display panel including a cathode disposed on the organic emission layer and connected to the auxiliary electrode, wherein the cathode overlaps the anode and the auxiliary electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Furthermore, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described with reference to the accompanying drawings.

Figure 2:
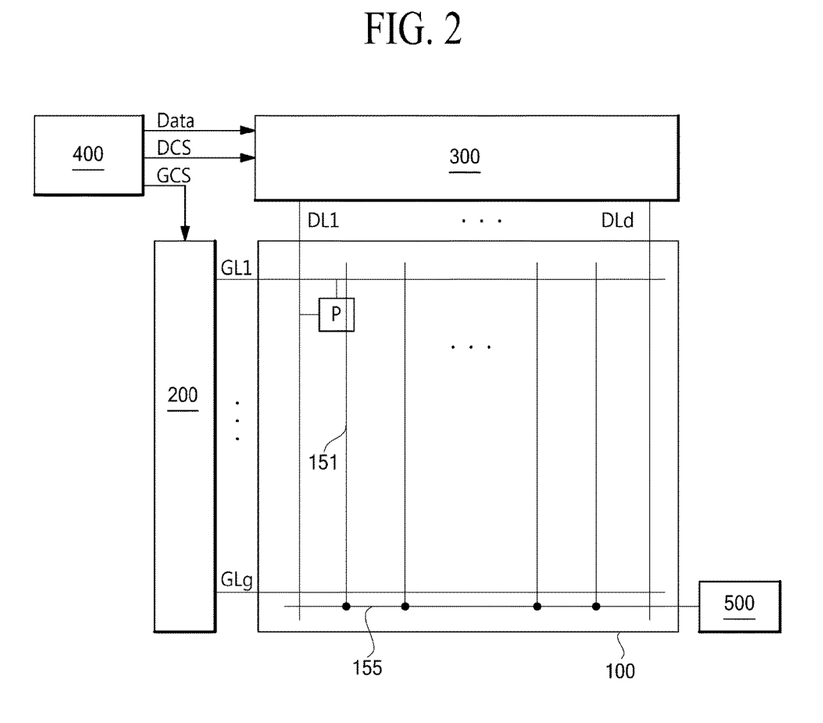
FIG. 2 is a plan view illustrating an organic light emitting display device according to an embodiment of the present invention.

FIG. 2 is a plan view illustrating an organic light emitting display device according to an embodiment of the present invention.

A display panel according to an embodiment of the present invention may be applied to the organic light emitting display device.

As illustrated in FIG. 2, the organic light emitting display device may include a display panel 100, a gate driver 200, a data driver 300, and a timing controller 400. The display panel 100 may include a plurality of sub-pixels P which are respectively provided in a plurality of areas defined by intersections of a plurality of gate lines GL1 to GLg and a plurality of data lines DL1 to DLd. In this case, the plurality of sub-pixels P may be defined by another means instead of the plurality of areas defined by intersections of the gate lines GL1 to GLg and the data lines DL1 to DLd. The gate driver 200 may supply a gate signal to the gate lines GL1 to GLg which are disposed in the display panel 100. The data driver 300 may respectively supply data signals to the data lines DL1 to DLd which are disposed in the display panel 100. The timing controller 400 may control a function of the gate driver 200 and a function of the data driver 300.

Each of the sub-pixels P may include an organic light emitting diode (OLED) for emitting light and a driving circuit for driving the OLED.

The OLED may include an anode, an organic emission layer (an organic compound layer), and a cathode. The anode may be connected to a transistor (TFT). An encapsulating part may be disposed on an upper side of the cathode.

The OLED may be implemented as a top emission type, where light emitted from the organic emission layer is irradiated in a direction from a lower substrate (an array substrate) to an upper substrate, or a bottom emission type where the light emitted from the organic emission layer is irradiated in a direction from the upper substrate to the lower substrate (the array substrate). The OLED may emit light having certain luminance according to a current supplied from a driving transistor.

The anode of the OLED may be electrically connected to a first power source. The cathode may be connected to a second power source 500 through a below-described auxiliary electrode. In this case, the auxiliary electrode may be electrically connected to a supply electrode 151 through a connection electrode disposed under the auxiliary electrode. Therefore, a plurality of supply electrodes 151 relevant to the sub-pixels P may be connected to the second power source 500 through a power supply line 155 in common.

The driving circuit may be electrically connected to a corresponding data line (hereinafter referred to as a data line) DL and a corresponding gate line (hereinafter referred to as a gate line) GL to control driving of the OLED. In this case, the driving circuit may include the driving transistor, a switching transistor, and a storage capacitor, but is not limited thereto. When the gate signal is supplied to the gate line GL, the driving circuit may control an amount of current supplied to the OLED according to a data signal supplied through the data line DL.

In this case, the driving transistor may be electrically connected between the first power source and the OLED. The switching transistor may be electrically connected to the driving transistor, the data line DL, and the gate line GL.

Figure 3:
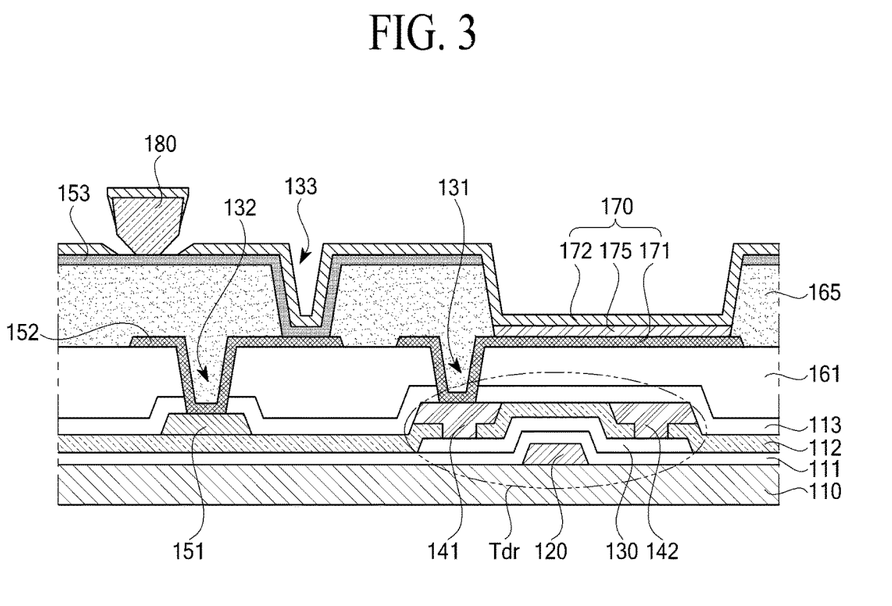
FIG. 3 is a cross-sectional view illustrating an organic light emitting display device according to an embodiment of the present invention.

FIG. 3 is a cross-sectional view illustrating an organic light emitting display device according to an embodiment of the present invention.

As illustrated in FIG. 3, the organic light emitting display device may include a driving transistor Tdr, a supply electrode 151, a first overcoating layer 161, a first electrode 171, a connection electrode 152, a second overcoating layer 165, an auxiliary electrode 153, a partition wall 180, an organic emission layer 175, and a second electrode 172.

The driving transistor Tdr may include a first driving electrode 141 and may be disposed on a substrate 110. The supply electrode 151 may be disposed on the same layer as the first driving electrode 141 of the driving transistor Tdr.

The first overcoating layer 161 may be disposed on the driving transistor Tdr and the supply electrode 151. The first electrode 171 may be connected to the first driving electrode 141 and may be disposed on the first overcoating layer 161. The connection electrode 152 may be connected to the supply electrode 151 and may be disposed on the first overcoating layer 161. Therefore, the first electrode 171 and the connection electrode 152 may be disposed on the same layer.

The second overcoating layer 165 may be disposed on the first overcoating layer 161. In this case, the second overcoating layer 165 may insulate the first electrode 171 from the connection electrode 152 and may cover an upper side of the connection electrode 152.

The auxiliary electrode 153 may be connected to the connection electrode 152 and may be disposed on the second overcoating layer 165. The partition wall 180 may be disposed on the auxiliary electrode 153.

The organic emission layer 175 may be disposed on the first electrode 171. The second electrode 172 may be disposed on the organic emission layer 175. In this case, the second electrode 172 may be electrically connected to the auxiliary electrode 153.

The driving transistor Tdr may include a gate electrode 120, an active layer 130, a first driving electrode 141, and a second driving electrode 142. In this case, the first driving electrode 141 may be a source electrode, and the second driving electrode 142 may be a drain electrode. In other embodiments, the first driving electrode 141 may be the drain electrode, and the second driving electrode 142 may be the source electrode.

The gate electrode 120 may be disposed on a substrate 110. A gate insulation layer 111 may be disposed on the gate electrode 120. The active layer 130 may be disposed on the gate insulation layer 111. In this case, the active layer 130 may overlap the gate electrode 120. A dielectric interlayer 112 may be disposed on the active layer 130. The first driving electrode 141 and the second driving electrode 142 may be disposed on the dielectric interlayer 112. In this case, the first driving electrode 141 and the second driving electrode 142 may be electrically connected to the active layer 130.

The driving transistor Tdr may be disposed in each of a plurality of sub-pixels on the substrate 110. A configuration of the driving transistor Tdr is not limited to the above-described example and may be variously modified to be easily implemented by those skilled in the art.

The supply electrode 151 may be disposed on the dielectric interlayer 112. In this case, the supply electrode 151 may be disposed to be spaced apart from the first and second driving electrodes 141 and 142. Therefore, the supply electrode 151 may be disposed on the same layer as the first and second driving electrodes 141 and 142. In this case, the supply electrode 151 and the first and second driving electrodes 141 and 142 may be formed through the same process and may be formed of the same material, but are not limited thereto.

The supply electrode 151 may be electrically connected to the cathode electrode 172 through the connection electrode 152 and the auxiliary electrode 153. In this case, the supply electrode 151 may apply the same voltage to the cathode 172 through the connection electrode 152 and the auxiliary electrode 153.

A passivation layer 113 may be disposed on the driving transistor Tdr. The passivation layer 113 may include a first contact hole 131 and a second contact hole 132. The passivation layer 113 may protect the driving transistor Tdr and the supply electrode 151.

The first overcoating layer 161 may be disposed on the passivation layer 113. The first overcoating layer 161 may include the first contact hole 131 and the second contact hole 132 like the passivation layer 113. In this case, the first driving electrode 141 may be connected to the first electrode 171 through the first contact hole 131, and the supply electrode 151 may be connected to the connection electrode 152 through the second contact hole 132. The first overcoating layer 161 may planarize an upper surface of the driving transistor Tdr. The first overcoating layer 161 may be formed of, for example, one or more of polyacrylates resin, epoxy resin, phenolic resin, polyamides resin, polyimides resin, unsaturated polyesters resin, poly-phenylenethers resin, polyphenylenesulfides resin, benzocyclobutene, and/or the like, but is not limited thereto.

The first electrode 171 may be disposed on the first overcoating layer 161. In this case, the first electrode 171 may be electrically connected to the first driving electrode 141 through the first contact hole 131. The first electrode 171 may act as an anode electrode or a cathode electrode depending on the type of the driving transistor Tdr. For example, the first electrode 171 may perform a function of an anode of the OLED 170 and may include a transparent conductive material having a large work function value. For example, the first electrode 171 may be formed of indium tin oxide (ITO), indium zinc oxide (IZO), and/or the like. Also, the first electrode 171 may include a metal material which is good in reflection efficiency. For example, the first electrode 171 may be formed of at least two or more layers including aluminum (Al), silver (Ag), Ag;Pb;Cu (APC), and/or the like.

The connection electrode 152 may be disposed on the first overcoating layer 161. That is, the connection electrode 152 may be disposed on the same layer as the first electrode 171. In this case, the connection electrode 152 may be disposed to be spaced apart from the first electrode 171. The connection electrode 152 may be electrically connected to the supply electrode 151 through the second contact hole 132. The connection electrode 152 and the first electrode 171 may be formed through the same process. In this case, the connection electrode 152 and the first electrode 171 may be formed of the same material, but are not limited thereto.

The second overcoating layer 165 may be disposed on the connection electrode 152 and the first electrode 171. The second overcoating layer 165 may be disposed on the first overcoating layer 161 and may cover the first and second contact holes 131 and 132 included in the first overcoating layer 161. Also, the second overcoating layer 165 may cover a portion of the first electrode 171, but may not cover the other portion of the first electrode 171. The organic emission layer 175 may be disposed on the other portion of the first electrode 171 which is not covered by the second overcoating layer 165. The second overcoating layer 165 may cover an upper side of the connection electrode 152. In this case, the second overcoating layer 165 may include a third contact hole 133. Therefore, the connection electrode 152 may be electrically connected to the auxiliary electrode 153 through the third contact hole 133. The second overcoating layer 165 may cover the portion of the first electrode 171 and the upper side of the connection electrode 152. The second overcoating layer 165 may divide two adjacent sub-pixels. In this case, the second overcoating layer 165 disposed between the two adjacent sub-pixels may include a top having a certain width and a bottom having a width which is broader than the width of the top. That is, the second overcoating layer 165 may have a taper structure where a side is inclined. The second overcoating layer 165 may be formed through a dry etching process. The dry etching process may be an etching process which uses reaction based on gas plasma without using chemical drug. The second overcoating layer 165 may be formed of the same material as that of the first overcoating layer 161, but is not limited thereto.

The auxiliary electrode 153 may be disposed on the second overcoating layer 165. In this case, the auxiliary electrode 153 may be electrically connected to the connection electrode 152 through the third contact hole 133. The auxiliary electrode 153 may be formed to cover an upper side of the second overcoating layer 165. In this case, a width of the auxiliary electrode 153 may be the same as that of the upper side of the second overcoating layer 165, but the present embodiment is not limited thereto.

As described above, the auxiliary electrode 153 may be disposed on the second overcoating layer 165 and may not be disposed on the same layer as the first electrode 171. Therefore, at least a portion of the auxiliary electrode 153 may overlap at least a portion of the first electrode 171 with the second overcoating layer 165 therebetween. Therefore, a width of the first electrode 171 may be broader than when the auxiliary electrode 153 and the first electrode 171 are formed on the same layer. Thus, an opening width of the first electrode 171 may be broader than when the auxiliary electrode 153 and the first electrode 171 are formed on the same overcoating layer. The opening width may be a width of a portion of the first electrode 171, which is not covered by the second overcoating layer 165, in one sub-pixel. For example, the opening width may be further enlarged by a maximum of 8 μm than when the auxiliary electrode 153 and the first electrode 171 are formed on the same overcoating layer in one sub-pixel. Therefore, when the opening width is enlarged, an aperture ratio of each sub-pixel is enhanced. For example, the aperture ratio may be further enhanced by a maximum of 90.7% than when the auxiliary electrode 153 and the first electrode 171 are formed on the same overcoating layer in one sub-pixel. The opening width and the aperture ratio may be numerical values which may be changed depending on a design. Also, as the aperture ratio is enhanced, the image quality and lifetime of an organic light emitting display device are enhanced. The auxiliary electrode 153 may be electrically connected to the second electrode 172. In this case, the auxiliary electrode 153 may apply the same voltage to a plurality of second electrodes 172. Accordingly, the luminance uniformity of the organic light emitting display device is enhanced.

The partition wall 180 may be disposed on the auxiliary electrode 153. In this case, the partition wall 180 may contact an upper side of the auxiliary electrode 153. The partition wall 180 may have a reverse taper structure where a width of a bottom of the partition wall 180 is narrower than that of a top of the partition wall 180. The reverse taper structure may be a structure where both side surfaces of the partition wall 180 are inclined to be symmetrical about a center line and the width of the bottom of the partition wall 180 is narrower than that of the top of the partition wall 180. Side surfaces of the partition wall 180 may include one inclined surface, but the present embodiment is not limited thereto. In other embodiments, the side surfaces of the partition wall 180 may include two or more inclined surfaces.

The organic emission layer 175 may be disposed on the first electrode 171. The organic emission layer 175 may be disposed on the portion of the first electrode 171 which is not covered by the second overcoating layer 165. Therefore, the organic emission layer 175 may not overlap the second overcoating layer 165 and the auxiliary electrode 153. The organic emission layer 175 may be formed to have a structure of a hole transport layer/emission layer/electron transport layer or a structure of a hole injection layer/hole transport layer/emission layer/electron transport layer/electron injection layer. Furthermore, the organic emission layer 175 may further include a function layer for enhancing the emission efficiency and/or lifetime of the emission layer. In the structure of the organic emission layer, one or more layers may include a function of another layer. Therefore, one or more layers may be removed or added, and thus, the structure of the organic emission layer 175 is not limited thereto.

The organic emission layer 175 may be disposed on the first electrode 171, the partition wall 180, and the auxiliary electrode 153. In this case, the organic emission layer 175 may not be disposed near an area where the partition wall 180 contacts the auxiliary electrode 153. Therefore, a plurality of organic emission layers 175 which are respectively formed in two sub-pixels adjacent to the second overcoating layer 165 may be divided by the partition wall 165. This is merely an embodiment, and in other embodiments, the organic emission layers 175 which are respectively formed in the two sub-pixels adjacent to the second overcoating layer 165 may be connected to each other.

The second electrode 172 may be formed on the substrate 110 including the organic emission layer 175. In this case, the second electrode 172 may be disposed on the organic emission layer 175 and may overlap the first electrode 171 and the auxiliary electrode 153. Therefore, the second electrode 172 may be electrically connected to the auxiliary electrode 153. If the first electrode 171 functions as an anode electrode, the second electrode 172 may function as a cathode electrode. The second electrode 172 may use a metal material which is very thin in thickness and is low in work function. For example, the second electrode 172 may use a metal material such as Ag, Ti, Al, Mo, an alloy of Ag and Mg, and/or the like. In this case, the second electrode 172 may be formed of the metal material to have a thickness (for example, 200 Å or less) of hundreds Å or less. Therefore, the second electrode 172 may be formed of a semi-transmissive layer and may be substantially used as a transparent cathode. However, the present embodiment is not limited thereto, and in other embodiments, the second electrode 172 may use carbon nano tube, graphene, and/or the like. Also, in order to lower a resistance of the second electrode 172, a material such as ITO, IZO, and/or the like having a high transmittance ratio may be additionally deposited on the second electrode 172. The second electrode 172 may not be disposed in a partial area near a contact area where the partition wall 180 contacts the auxiliary electrode 153. Also, the second electrode 172 may be disposed on the top of the partition wall 180 having a reverse taper shape. This is merely an embodiment, and in other embodiments, the second electrode 172 may cover up to a side surface of the partition wall 180.

The OLED 170, as described above, may include the first electrode 171, the organic emission layer 175, and the second electrode 172 and may emit light according to driving of the driving transistor Tdr.

Figure 4:
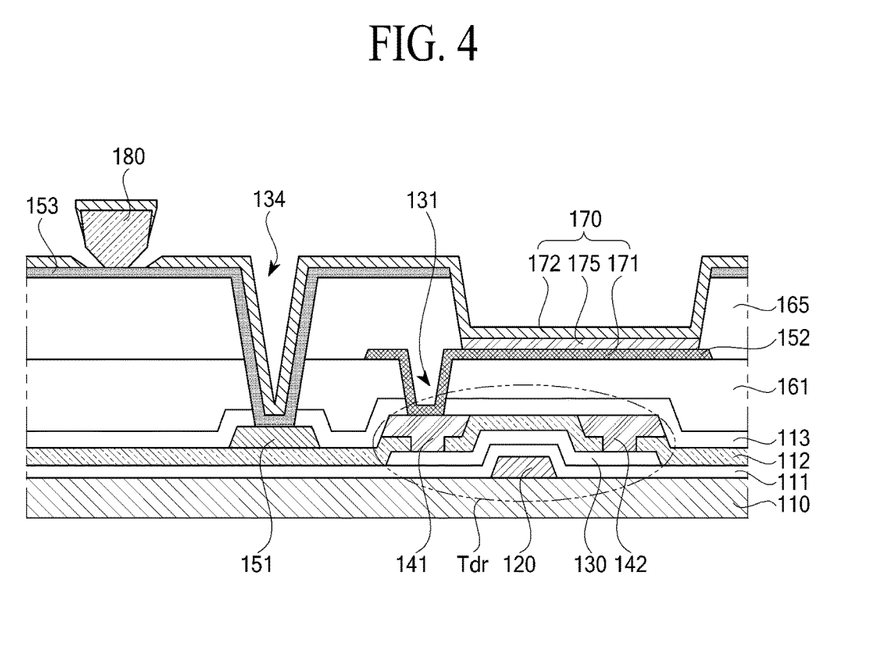
FIG. 4 is a cross-sectional view illustrating an organic light emitting display device according to another embodiment of the present invention.

FIG. 4 is a cross-sectional view illustrating an organic light emitting display device according to another embodiment of the present invention. In describing the present embodiment, elements which are the same as or correspond to the preceding embodiment are not described. Hereinafter, the organic light emitting display device according to another embodiment of the present invention will be described with reference to FIG. 4.

As illustrated in FIG. 4, the organic light emitting display device may include a driving transistor Tdr, a supply electrode 151, a first overcoating layer 161, a first electrode 171, a second overcoating layer 165, an auxiliary electrode 153, a partition wall 180, an organic emission layer 175, and a second electrode 172. The elements are the same as the elements of the organic light emitting display device described above with reference to FIG. 3, and thus, their detailed descriptions are not repeated.

Referring to FIG. 4, the organic light emitting display device may not include the connection electrode 152. Therefore, the supply electrode 151 may be directly connected to the auxiliary electrode 153.

The first overcoating layer 161 may be disposed on a passivation layer 113. Also, the second overcoating layer 165 may be disposed on the first overcoating layer 165. Each of the first and second overcoating layers 161 and 165 may include a fourth contact hole 134. In this case, the first and second overcoating layers 161 and 165 may be formed, and then, the fourth contact hole 134 may be simultaneously formed in the first and second overcoating layers 161 and 165. Therefore, each of the first and second overcoating layers 161 and 165 may include the fourth contact hole 134.

The auxiliary electrode 153 may be disposed on the second overcoating layer 165. In this case, the auxiliary electrode 153 may be directly and electrically connected to the supply electrode 151 through the fourth contact hole 134. The auxiliary electrode 153 may be formed to cover an upper side of the second overcoating layer 165. In this case, a width of the auxiliary electrode 153 may be the same as that of the top of the second overcoating layer 165, but the present embodiment is not limited thereto.

As described above, since the auxiliary electrode 153 is directly and electrically connected to the supply electrode 151 without using the connection electrode 152, a width of the auxiliary electrode 153 and a width of the second overcoating layer 165 are reduced. Therefore, a width of the first electrode 171 may become broader, and an opening width of the first electrode 171 may become broader. Therefore, an aperture ratio of each sub-pixel is enhanced. Also, as the aperture ratio is enhanced, the image quality and lifetime of an organic light emitting display device are enhanced.

FIGS. 5A to 5G are cross-sectional views for describing a method of manufacturing an organic light emitting display device according to an embodiment of the present invention. Particularly, FIGS. 5A to 5G illustrate respective cross-section views of a plurality of operations included in the method of manufacturing the organic light emitting display device according to an embodiment of the present invention.

Figure 5A:
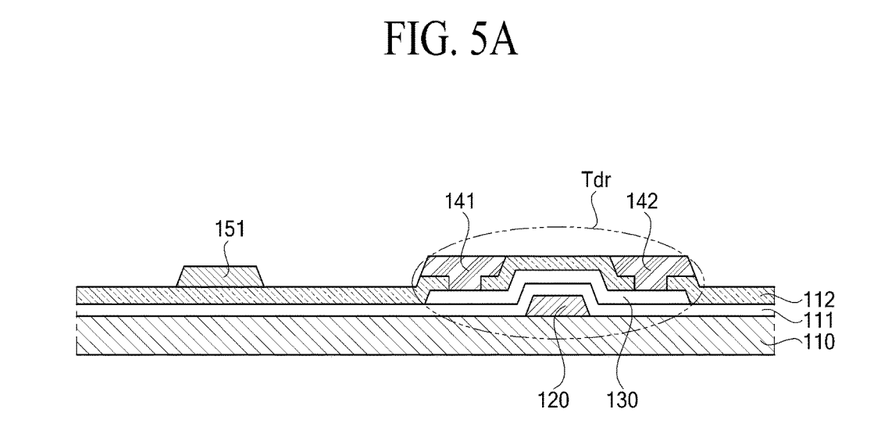
FIGS. 5A to 5G are cross-sectional views for describing a method of manufacturing an organic light emitting display device according to an embodiment of the present invention.

First, as illustrated in FIG. 5A, the driving transistor Tdr including the gate electrode 120, the active layer 130, the first driving electrode 141, and the second driving electrode 142 may be formed on the substrate 110. In this case, the gate insulation layer 111 may be formed on the gate electrode 120, and the active layer 130 may be formed on the gate insulation layer 111. Also, the dielectric interlayer 112 may be formed on the active layer 130.

The gate electrode 120 may be formed on the substrate 110. The gate electrode 120 may be formed of one of Mo, Al, Cr, Au, Ti, Ni, Nd, and Cu or an alloy thereof, but is not limited thereto. In other embodiments, the gate electrode 120 may be formed of various materials. Also, the gate electrode 120 may be formed of a single layer or a multilayer.

The gate insulation layer 111 may be formed on the gate electrode 120. The gate insulation layer 111 may insulate the gate electrode 120 from the active layer 130 which will be formed later. In this case, the gate insulation layer 111 may be formed of silicon oxide (SiOx), silicon nitride (SiNx), or a multilayer thereof, but is not limited thereto.

The active layer 130 may be formed on the gate insulation layer 111. The active layer 130 may be formed of amorphous silicon, polycrystalline silicon, an oxide semiconductor, and/or the like.

The dielectric interlayer 112 may be formed on the active layer 130. In this case, the dielectric interlayer 112 may be formed of the same material as that of the gate insulation layer 111, but is not limited thereto.

The first driving electrode 141 and the second driving electrode 142 may be formed on the dielectric interlayer 112. Each of the first driving electrode 141 and the second driving electrode 142 may be formed of one of Mo, Al, Cr, Au, Ti, Ni, Nd, and Cu or an alloy thereof, but is not limited thereto. In other embodiments, the first driving electrode 141 and the second driving electrode 142 may be formed of various materials. Also, each of the first driving electrode 141 and the second driving electrode 142 may be formed of a single layer or a multilayer. In this case, the supply electrode 151 may be formed on the dielectric interlayer 112 to be spaced apart from the first driving electrode 141 and the second driving electrode 142. The supply electrode 151 may be formed on the same layer as the first driving electrode 141 and the second driving electrode 142. The supply electrode 151, the first driving electrode 141, and the second driving electrode 142 may be formed through the same process and may be formed of the same material, but are not limited thereto.

The supply electrode 151 may be electrically connected to the cathode electrode 172 through the connection electrode 152 and the auxiliary electrode 153. In this case, the supply electrode 151 may apply the same voltage to the cathode 172 through the connection electrode 152 and the auxiliary electrode 153.

The driving transistor Tdr may be disposed in each of a plurality of sub-pixels on the substrate 110. A configuration of the driving transistor Tdr is not limited to the above-described example and may be variously modified to be easily implemented by those skilled in the art.

Figure 5B:
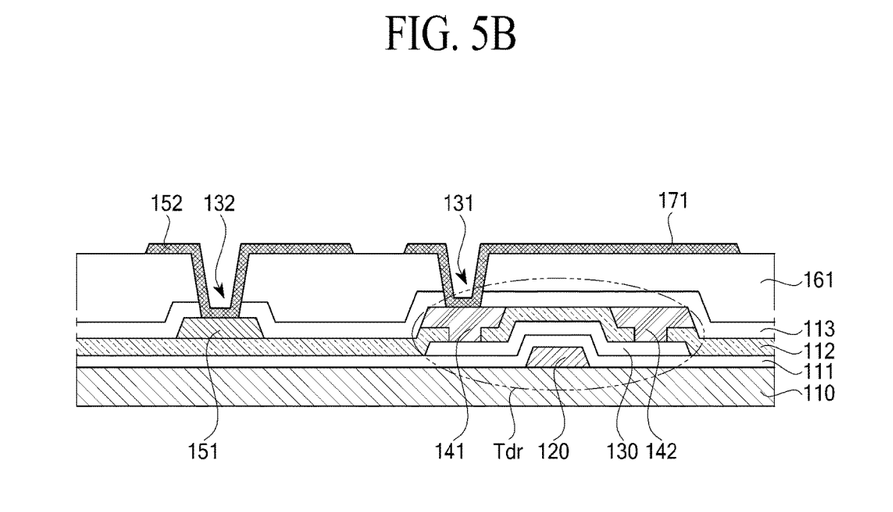

Subsequently, as illustrated in FIG. 5B, the passivation layer 113 may be disposed on the driving transistor Tdr. The passivation layer 113 may include the first contact hole 131 and the second contact hole 132. In this case, the first driving electrode 141 of the driving transistor Tdr may be connected to the first electrode 171 through the first contact hole 131, and the supply electrode 151 may be connected to the connection electrode 152 through the second contact hole 132. Also, the passivation layer 113 may protect the driving transistor Tdr and the supply electrode 151.

A first planarization layer (or the first overcoating layer) 161 may be disposed on the passivation layer 113. The first planarization layer 161 may include the first contact hole 131 and the second contact hole 132 like the passivation layer 113. In this case, the first driving electrode 141 may be connected to the first electrode 171 through the first contact hole 131, and the supply electrode 151 may be connected to the connection electrode 152 through the second contact hole 132. The first planarization layer 161 may planarize an upper surface of the substrate where the driving transistor Tdr is formed. The first planarization layer 161 may be formed of, for example, one or more of polyacrylates resin, epoxy resin, phenolic resin, polyamides resin, polyimides resin, unsaturated polyesters resin, poly-phenylenethers resin, polyphenylenesulfides resin, benzocyclobutene, and/or the like, but is not limited thereto.

The first electrode 171 may be disposed on the first planarization layer 161. The first electrode 171 may be formed to be electrically connected to the first driving electrode 141 through the first contact hole 131. The first electrode 171 may be formed in each of the plurality of sub-pixels and may be patterned through a photolithography process.

The first electrode 171 may act as an anode electrode or a cathode electrode depending on the type of the driving transistor Tdr. According to the present embodiment, the first electrode 171 may perform a function of an anode of the OLED 170 and may include a transparent conductive material having a large work function value. For example, the first electrode 171 may be formed of indium tin oxide (ITO), indium zinc oxide (IZO), and/or the like. Also, the first electrode 171 may include a metal material which is good in reflection efficiency. For example, the first electrode 171 may be formed of at least two or more layers including aluminum (Al), silver (Ag), Ag;Pb;Cu (APC), and/or the like.

The connection electrode 152 may be formed on the first planarization layer 161. That is, the connection electrode 152 may be formed on the same layer as the first electrode 171. In this case, the connection electrode 152 may be disposed to be spaced apart from the first electrode 171. The connection electrode 152 may be electrically connected to the supply electrode 151 through the second contact hole 132. The connection electrode 152 and the first electrode 171 may be formed through the same process. In this case, the connection electrode 152 and the first electrode 171 may be formed of the same material, but are not limited thereto.

Figure 5C:
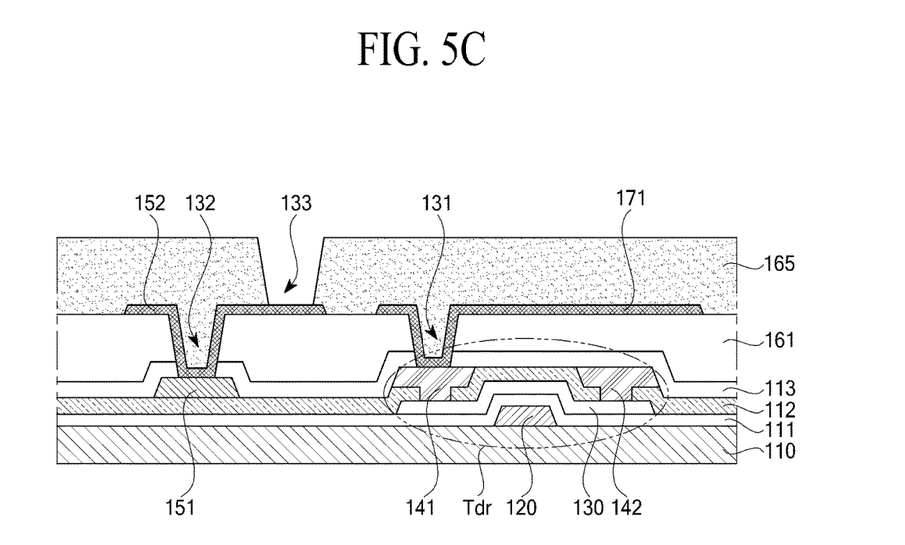

As illustrated in FIG. 5C, a second planarization layer (or the second overcoating layer) 165 may be formed on the first planarization layer 161. The second planarization layer 165 may be formed to cover the connection electrode 152 and the first electrode 171. Also, the second planarization layer 165 may be formed to cover the first and second contact holes 131 and 132. For example, a material such as polyacrylates resin and/or the like may be coated on the substrate 110, and then, the second planarization layer 165 may be formed through a process of developing and curing the coated material.

The second planarization layer 165 may include the third contact hole 133. In this case, the connection electrode 152 may be exposed through the third contact hole 133. The second planarization layer 165 may be formed to cover the first contact hole 131, the second contact hole 132, an upper side of the first electrode 171, and an upper side of the connection electrode 152 except the third contact hole 133. In this case, the second planarization layer 165 may be formed of the same material as that of the first planarization layer 161. That is, the second planarization layer 165 may be formed of, for example, one or more of polyacrylates resin, epoxy resin, phenolic resin, polyamides resin, polyimides resin, unsaturated polyesters resin, poly-phenylenethers resin, polyphenylenesulfides resin, benzocyclobutene, and/or the like, but is not limited thereto.

Figure 5D:
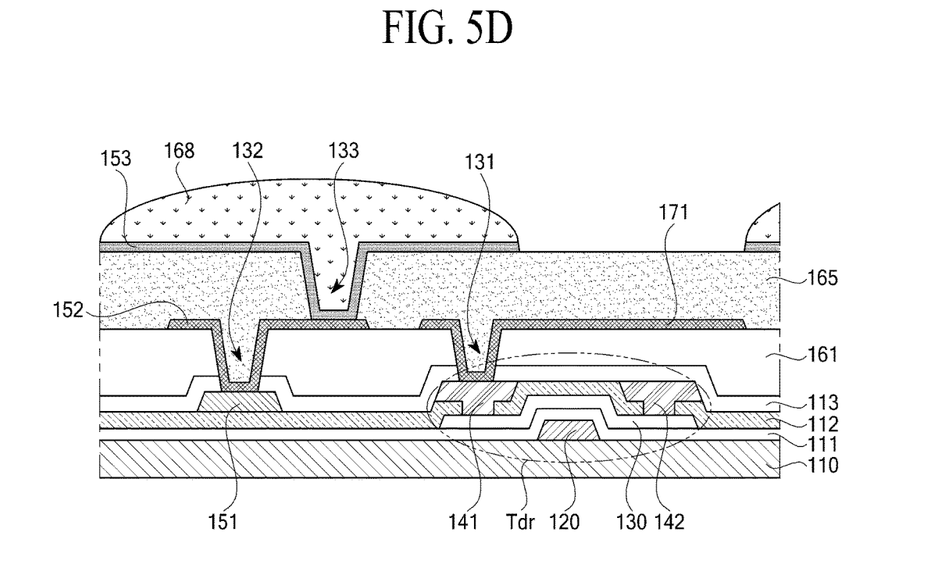

As illustrated in FIG. 5D, the auxiliary electrode 153 may be formed on the second planarization layer 165. The auxiliary electrode 153 may be formed to be electrically connected to the connection electrode 152 through the third contact hole 133.

The auxiliary electrode 153 may be formed through the photolithography process using a photoresist (PR). The photolithography process may be a process of forming a pattern on the substrate 110. An operation of forming the auxiliary electrode 153 may include: an operation of depositing an electrode material on the second planarization layer 165; an operation of coating a photoresist on the electrode material; an operation of irradiating (or exposing) light onto a specific region of the coated photoresist by using a photo mask; an operation of removing a photoresist disposed in the specific region onto which the light is irradiated; and an operation of forming the auxiliary electrode 153 by etching the electrode material which has been exposed by removing the photoresist disposed in the specific region. Therefore, the auxiliary electrode 153 may be formed in an area instead of the specific region, and the photoresist may remain on the auxiliary electrode 153. In this case, the specific region may be a partial region of the first electrode 171, which is exposed, in a region of the first electrode 171 covered by the second planarization layer 165. In this case, the auxiliary electrode 153 may be formed of the same material as those of the supply electrode 151, the first driving electrode 141, and the second driving electrode 142. Also, the auxiliary electrode 153 may be formed of the same material as those of the connection electrode 152 and the first electrode 171. The auxiliary electrode 153 may be formed of, for example, one of Mo, Al, Cr, Au, Ti, Ni, Nd, and Cu or an alloy thereof. Also, the auxiliary electrode 153 may be formed of a single layer or a multilayer. The auxiliary electrode 153 may be formed of, for example, indium tin oxide (ITO), indium zinc oxide (IZO), and/or the like. Also, the auxiliary electrode 153 may be formed of at least two or more layers including a metal material (for example, aluminum (Al), silver (Ag), Ag;Pb;Cu (APC), and/or the like) which is good in reflection efficiency.

Figure 5E:
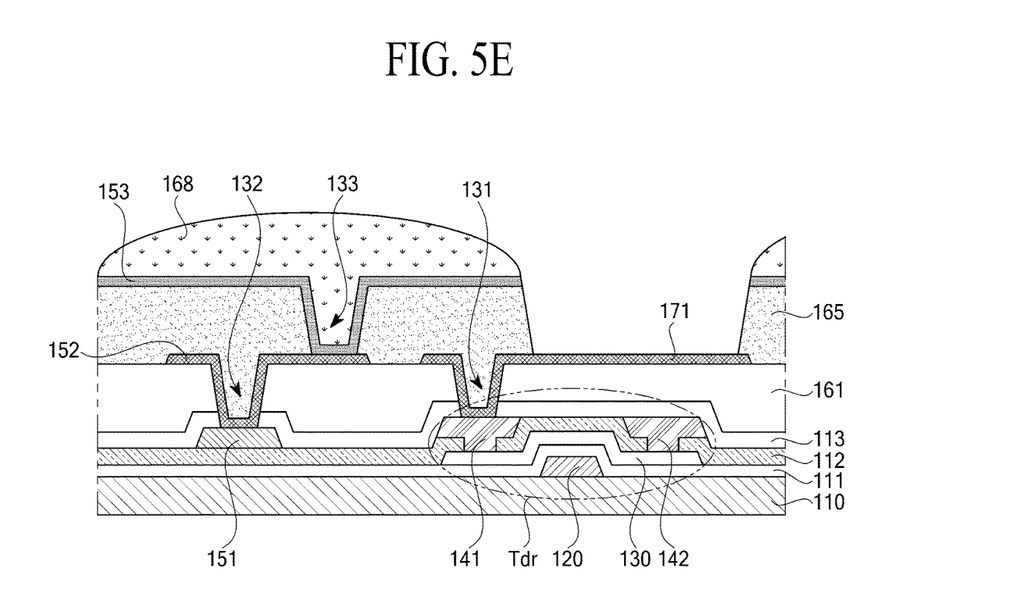

As illustrated in FIG. 5E, a photoresist 168 remaining on the auxiliary electrode 153 may be used as a blocking mask when a specific region of the second planarization layer 165 is etched. That is, a region of the second planarization layer 165 where the photoresist 168 remains may not be etched, and the specific region where the photoresist 168 does not remain may be etched. In this case, the specific region where the photoresist 168 does not remain may be a partial region of the first electrode 171 which is exposed by etching the second planarization layer 165. Therefore, since the specific region of the second planarization layer 165 is etched, the partial region of the first electrode 171 may be exposed. In this case, the second planarization layer 165 may cover a portion of the first electrode 171.

A process of etching the second planarization layer 165 may be performed prior to an operation of removing the photoresist 168 remaining on the auxiliary electrode 153.

At this time, the second planarization layer 165 may be in a cured state. Therefore, in a case of etching the second planarization layer 165 through a wet etching process, the second planarization layer 165 is not easily etched. Also, if the second planarization layer 165 is etched through the wet etching process, the first electrode 171 is damaged. Therefore, the second planarization layer 165 may be etched through a dry etching process. The dry etching process may be a process that performs etching by using a gas plasma reaction instead of liquid. After the specific region of the second planarization layer 165 is etched, the photoresist 168 remaining on the auxiliary electrode 153 may be removed. Therefore, the second planarization layer 165 may insulate the connection electrode 152 from the first electrode 171 and may cover an upper side of the connection electrode 152. Also, the second planarization layer 165 may be disposed between two adjacent sub-pixels.

As described above, the first electrode 171 connected to the driving transistor Tdr and the connection electrode 162 connected to the supply electrode 151 may be formed on the first planarization layer 161. The second planarization layer 165 may be formed to cover the first electrode 171 and the connection electrode 162. The auxiliary electrode 153 may be formed on the second planarization layer 165 to be connected to the connection electrode 162. Therefore, the auxiliary electrode 153 and the first electrode 171 may not be formed on the same layer. Therefore, at least a portion of the auxiliary electrode 153 may overlap at least a portion of the first electrode 171 with the second planarization layer 165 therebetween. Therefore, a width of the first electrode 171 may be broader than when the auxiliary electrode 153 and the first electrode 171 are formed on the same layer. Thus, an opening width of the first electrode 171 may be broader when the auxiliary electrode 153 and the first electrode 171 are not formed on the same planarization layer than when the auxiliary electrode 153 and the first electrode 171 are formed on the same planarization layer. The opening width may be a width of a portion of the first electrode 171, which is not covered by the second planarization layer 165, in one sub-pixel. Therefore, when the opening width is enlarged, an aperture ratio of each sub-pixel is enhanced. Also, as the aperture ratio is enhanced, the image quality and lifetime of an organic light emitting display device are enhanced.

Moreover, the photoresist formed on the auxiliary electrode 153 may be used as the blocking mask. Therefore, the specific region of the second planarization layer 165 may be etched by using the photoresist as the blocking mask. Thus, the number of masks is reduced. Accordingly, a manufacturing process of a display panel is simplified, thereby decreasing the manufacturing cost of the display panel.

Figure 5F:
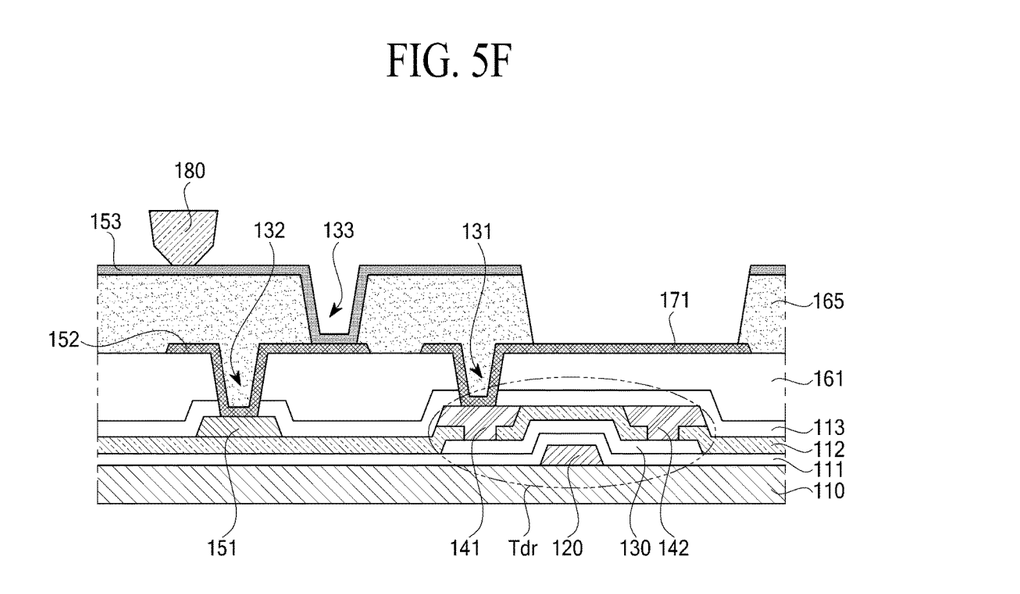

As illustrated in FIG. 5F, the partition wall 180 may be disposed on the auxiliary electrode 153. In this case, the partition wall 180 may be formed to contact the upper side of the auxiliary electrode 153. The partition wall 180 may be formed in a reverse taper structure where a width of a bottom of the partition wall 180 is narrower than that of a top of the partition wall 180. The reverse taper structure may be a structure where both side surfaces of the partition wall 180 are inclined to be symmetrical about a center line and the width of the bottom of the partition wall 180 is narrower than that of the top of the partition wall 180. Side surfaces of the partition wall 180 may include one inclined surface, but the present embodiment is not limited thereto. In other embodiments, the side surfaces of the partition wall 180 may include two or more inclined surfaces.

Figure 5G:
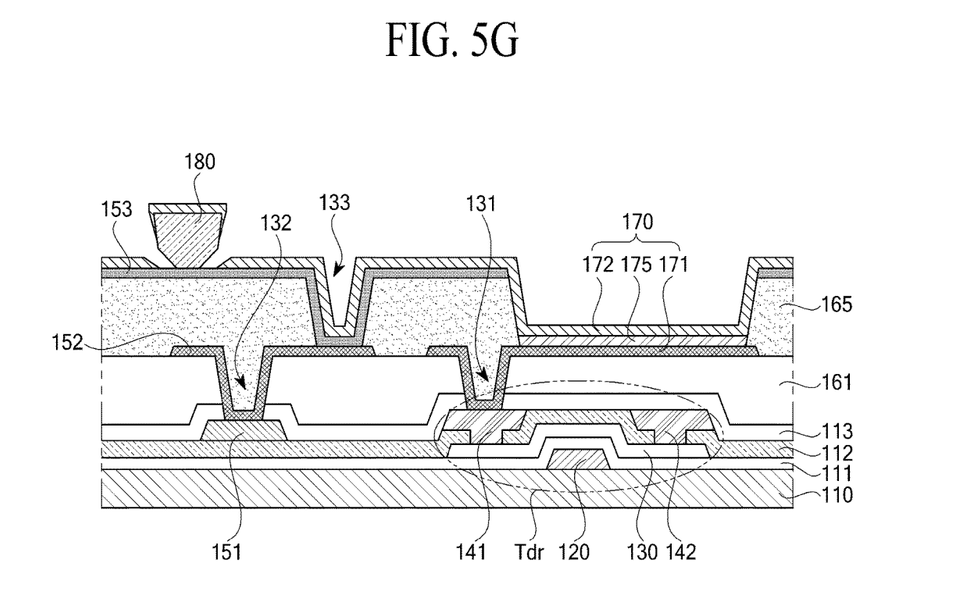

As illustrated in FIG. 5G, the organic emission layer 175 may be disposed on the first electrode 171. The organic emission layer 175 may be disposed on the portion of the first electrode 171 which is not covered by the second planarization layer 165. Therefore, the organic emission layer 175 may not overlap the second planarization layer 165 and the auxiliary electrode 153. The organic emission layer 175 may be disposed on the first electrode 171, the partition wall 180, and the auxiliary electrode 153. In this case, the organic emission layer 175 may not be disposed near an area where the partition wall 180 contacts the auxiliary electrode 153. That is, the organic emission layer 175 may not be formed in a partial region of the auxiliary electrode 153 covered by the partition wall 180. Therefore, a plurality of organic emission layers 175 which are respectively formed in two sub-pixels adjacent to the second planarization layer 165 may be divided by the partition wall 165. This is merely an embodiment, and in other embodiments, the organic emission layers 175 which are respectively formed in the two sub-pixels adjacent to the second planarization layer 165 may be connected to each other.

The second electrode 172 may be formed on the substrate 110 including the organic emission layer 175. Therefore, the second electrode 172 may be formed to be electrically connected to the auxiliary electrode 153. If the first electrode 171 functions as an anode electrode, the second electrode 172 may function as a cathode electrode. The second electrode 172 may use a metal material which is very thin in thickness and is low in work function. For example, the second electrode 172 may use a metal material such as Ag, Ti, Al, Mo, an alloy of Ag and Mg, and/or the like. In this case, the second electrode 172 may be formed of the metal material to have a thickness (for example, 200☐ or less) of hundreds ☐ or less. Therefore, the second electrode 172 may be formed of a semi-transmissive layer and may be substantially used as a transparent cathode. However, the present embodiment is not limited thereto, and in other embodiments, the second electrode 172 may use carbon nano tube, graphene, and/or the like. Also, in order to lower a resistance of the second electrode 172, a material such as ITO, IZO, and/or the like having a high transmittance ratio may be additionally deposited on the second electrode 172. The second electrode 172 may not be disposed in a partial area near a contact area where the partition wall 180 contacts the auxiliary electrode 153. Also, the second electrode 172 may be disposed on the top of the partition wall 180 having a reverse taper shape. This is merely an embodiment, and in other embodiments, the second electrode 172 may cover up to a side surface of the partition wall 180.

The OLED 170, as described above, may include the first electrode 171, the organic emission layer 175, and the second electrode 172 and may be formed in each of the plurality of sub-pixels. The OLED 170 may emit light according to driving of the driving transistor Tdr.

Moreover the encapsulating part may be formed on the substrate 110 that includes the OLED 170 and the driving transistor Tdr. The encapsulating part protects elements, such as the OLED 170, the driving transistor Tdr, etc., from an external impact and prevents the penetration of water.

According to the embodiments of the present invention, a thin film transistor (TFT) may be applied to a top gate structure and a bottom gate structure.

According to the embodiments of the present invention, since the auxiliary electrode is formed on the bank, the pixel area is enlarged, and an aperture ratio is enhanced. Also, the luminance uniformity and lifetime of an organic light emitting display device are enhanced. Also, since the number of masks which are used in the manufacturing process is reduced, a manufacturing process of a display panel is simplified, and thus, the manufacturing cost of the display panel is reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An organic light emitting display device comprising:
a first overcoating layer on a driving transistor and a supply electrode, the first overcoating layer including a first contact hole and a second contact hole;
a connection electrode on the first overcoating layer and connected to the supply electrode through the second contact hole;
a first electrode on the first overcoating layer and connected to the driving transistor through the first contact hole;

a second overcoating layer on the first overcoating layer, the second overcoating layer covering the first and second contact holes and not covering a portion of the first electrode;

an auxiliary electrode on the second overcoating layer and connected to the connection electrode, wherein the second overcoating layer comprises a third contact hole, and the auxiliary electrode is connected to the connection electrode through the third contact hole;

an organic emission layer on the portion of the first electrode which is not covered by the second overcoating layer;

a second electrode on the organic emission layer and electrically connected to the auxiliary electrode; and a partition wall on an upper surface of the auxiliary electrode and configured to electrically disconnect the second electrode between two adjacent sub-pixels, and wherein the auxiliary electrode is not overlapped with the organic emission layer.

2. The organic light emitting display device of claim 1, wherein the connection electrode is disposed on a same layer as the first electrode and comprises a same material as a material of the first electrode.

3. The organic light emitting display device of claim 1, wherein the second overcoating layer is disposed between two adjacent sub-pixels, and wherein the partition wall has a reverse taper structure where a width of a bottom of the partition wall is narrower than that of a top of the partition wall and the second electrode is not disposed in a partial area near a contact area where the partition wall contacts the auxiliary electrode.

4. The organic light emitting display device of claim 1, wherein the organic emission layer is not disposed near an area where the auxiliary electrode contacts the partition wall.

5. The organic light emitting display device of claim 1, wherein
the first electrode is an anode,
the second electrode is a cathode, and
light emitted from the organic emission layer is irradiated in a direction from the anode to the cathode.

6. An organic light emitting display panel comprising:
a first overcoating layer;
an anode on a portion of the first overcoating layer;
a second overcoating layer disposed on the first overcoating layer and partially covering the anode;
an organic emission layer on the anode;
a cathode layer on the organic emission layer and electrically connected to an auxiliary electrode; and
a partition wall on the auxiliary electrode,
wherein the organic light emitting display panel has a top emission type where at least a portion of the anode is overlapped with the auxiliary electrode disposed on the second overcoating layer with the second overcoating layer therebetween, and
wherein the partition wall electrically disconnects the cathode layer between two adjacent sub-pixels.

7. The organic light emitting display panel of claim 6, wherein the organic emission layer does not overlap the second overcoating layer and the auxiliary electrode.

8. The organic light emitting display panel of claim 7, wherein the cathode overlaps the anode and the auxiliary electrode.

* * * * *